(12) United States Patent
Yen et al.

(10) Patent No.: US 6,527,911 B1
(45) Date of Patent: Mar. 4, 2003

(54) CONFIGURABLE PLASMA VOLUME ETCH CHAMBER

(75) Inventors: Bi-Ming Yen, Fremont, CA (US); Tuqiang Ni, Fremont, CA (US); Lumin Li, Santa Clara, CA (US); David Hemker, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/895,537

(22) Filed: Jun. 29, 2001

(51) Int. Cl.[7] .................... H05H 1/00; H01L 21/00
(52) U.S. Cl. .................. 156/345.43; 156/345.47; 118/723 E
(58) Field of Search ................. 156/345.43, 345.47; 118/723 E

(56) References Cited

U.S. PATENT DOCUMENTS 4,838,978 A 6/1989 Sekine et al.
5,534,751 A * 7/1996 Lenz et al. ............. 315/111.71
6,008,130 A * 12/1999 Henderson et al. ......... 438/710
6,143,125 A * 11/2000 Shoji ...................... 156/345.25
6,178,919 B1 1/2001 Li et al.

FOREIGN PATENT DOCUMENTS

EP 0814495 12/1997
JP 58032417 2/1983

* cited by examiner

Primary Examiner—Thi Dang
(74) Attorney, Agent, or Firm—Martine & Penilla, LLP

(57) ABSTRACT

A plasma processing chamber is provided. The plasma processing chamber includes a bottom electrode configured to support a substrate and a top electrode located over the bottom electrode. The plasma processing chamber further includes a plasma confinement assembly designed to transition between a closed orientation and an open orientation. In the closed orientation, the plasma confinement assembly defines a first volume for plasma during processing, and in the open orientation, the plasma confinement assembly defines a second volume for plasma during processing which is larger than the first volume.

31 Claims, 7 Drawing Sheets

CONFIGURABLE PLASMA VOLUME ETCH CHAMBER

BACKGROUND OF THE INVENTION

1. Field of the Invention

The present invention relates generally to semiconductor fabrication and, more particularly, to plasma etching chambers with controlled plasma volume using a plurality of confinement structures.

2. Description of the Related Art

In semiconductor fabrication, plasma etching is commonly used to etch conductive and dielectric materials. Plasma etch chambers are typically used which are capable of etching selected layers deposited over a substrate as defined by a photoresist mask. In general, the processing chambers are configured to receive processing gases, and radio frequency (RF) power is applied to one or more electrodes in the processing chamber. The pressure within the chamber is controlled in accordance with a particular desired process. Upon applying the desired RF power to the electrode(s), the process gases in the chamber are activated such that a plasma is created. The plasma is configured to perform the desired etching of the selected layers of a semiconductor wafer.

In order to perform the desired etching of the selected layers of a semiconductor wafer, the plasma is typically configured by manipulating variations in such parameters as pressure, electron density, flow rate, and the like. In order to achieve the desired plasma parameter variations within a single processing environment, examples of modifiable parameters include the chemistry of the gases, the pressure within the chamber, and the amount of RF power applied to the RF electrode(s) within the chamber. The prior art, however, does not provide for the variation of the volume of plasma within a single chamber. Without the ability to vary the volume of plasma in a single processing chamber, it is generally necessary to utilize a plurality of differently-configured processing chambers in order to achieve optimum plasma characteristics for particular etching applications. The plurality of processing chambers need to be compatible within a processing system of etch chambers, or capable of being positioned and operated in close proximity to other processing chambers to ensure economical and efficient wafer transfer between process chambers for the various stages of etch processing.

Dual damascene fabrication includes a common multi-step etching process which illustrates a range of processing environments required for optimum feature fabrication. FIG. 1A is a flow chart diagram 100 illustrating the method operations for the etching processes of a typical via-first dual damascene fabrication process. The flow chart diagram 100 begins after the substrate has been deposited with the various layers that will define fabricated features, and the first photolithography process has been performed to define the first etching operation. The first etch process is performed in operation 102 in which a via structure is etched. In a typical via etching operation, at least two dielectric layers are etched to form the via structure. FIG. 1B shows an exemplary substrate 120, over which has been deposited a barrier layer 126*a*, first dielectric layer 122, an optional etch stop layer 126*b*, and a second dielectric layer 124. A photoresist layer 128*a* has been patterned to enable the etching of a via 130 through the second dielectric layer 124, the etch stop layer 126*b*, and the first dielectric layer 122. In one example, the material properties of the first dielectric layer 122 and the second dielectric layer 124 are different and require that two separate etching operations using two distinct etch chemistries be performed to fabricate the via 130 structure. Returning to FIG. 1A, the first etch process 102 includes one or more etching operations required to completely define the via structure 130.

The method continues with operation 104 in which the remaining photoresist layer 128*a* (FIG. 1B) is removed. As is known, photolithography is used to define features in semiconductor manufacturing. In the instant example, the locations of the vias were first defined and then the via structures were etched. The remaining photoresist is removed in operation 104 so that the next feature can be defined and etched.

The method continues with operation 106 in which the next feature in the fabrication operation is patterned. By way of example, a next layer of photoresist is coated and then imaged to define the next feature, the trench structures. Using photolithography, the trenches are next defined in accordance with known feature fabrication processes.

The method advances to operation 108 in which the second etch process is performed. The second etch process in the instant example is the etching of the trench structures. FIG. 1C shows the exemplary structure of FIG. 1B in which a via 130 was etched as described in operation 102 above. The photoresist 128*b* has been removed to define the trench structure 132 which is etched through the second dielectric layer 124 and to the etch stop layer 126*b*.

Returning once again to FIG. 1A, the method advances to operation 110 in which the remaining photoresist 128*b* (Figure 1C) is removed. Once the second etch process is completed and the trench structures are fabricated, the remaining photoresist used to define the trench structures is removed.

The method continues with operation 112 in which the silicon nitride (SiN) layers are etched, and the method is done. FIG. 1D shows the completed features defined using etching processes in the example fabrication of a dual damascene structure. The barrier layer 126*a* that was within the via feature 130 is etched to expose the substrate 120. The etch stop 126*b* that was in the trench feature 132 between the first dielectric layer 122 and the second dielectric layer 124 is likewise etched. Both the etch stop 126*b*, an optional layer depending on the particular structure and process, and the barrier 126*a* are typically layers of SiN, the removal of which are the final etching steps in the instant dual damascene fabrication example. As is known, the etching processes are typically followed by deposition of barriers and/or metallization to fabricate the trenches and vias of the dual damascene structure.

As illustrated in the flow chart diagram 100 of FIG. 1A, at least three separate etching, and two photoresist removal, operations are performed in the etching processes of a typical dual damascene fabrication operation. As will be described in greater detail below, the first etch process is best suited for a large volume plasma etch environment. Typically, in a large volume environment, high ion energy, also known as high bias voltage, is achieved at the surface of the substrate. In a large volume environment, high plasma flow rate is achieved at a low pressure. Because the first etch process includes etching through two dielectric layers in addition to an optional SiN etch stop layer, the higher bias at a higher flow rate are the desired plasma characteristics. A high plasma volume containment environment provides the optimal conditions for the most effective and efficient plasma.

The removal of photoresist is most optimally performed in a small volume oxygen plasma environment. In a small volume environment, the plasma is maintained very close to the surface of the wafer. The plasma achieved is generally very high density, and yields a very high photoresist removal rate. Additionally, in a small volume environment, ion energy to the wafer is low so that sputtering of the dielectric material can be minimized. A small plasma volume containment environment is generally desired for photoresist removal.

The second etch process can be either a large plasma volume environment or a small plasma volume environment, and needs to be optimized in accordance with the materials utilized. By way of example, the etch stop layer 126b (FIGS. 1B, 1C, and 1D) is an optional layer. Further, the first dielectric layer 122 and the second dielectric layer 124 can be of various similar or disparate dielectric materials, and their particular material properties dictate the etch chemistries needed to etch the second dielectric layer 124 down to the optional etch stop layer 126b or the first dielectric layer 122. If an etch stop layer 126b is used, a small plasma volume containment environment is commonly used to achieve a high etch rate. Generally, either a large volume or a small volume containment is selected depending on materials and configuration which will provide the best etching uniformity across the wafer.

Finally, the SiN etch is typically optimal in a small plasma volume containment environment to achieve high plasma density which yields high etch rate and low ion energy toward the wafer. Low ion energy toward the wafer will minimize the sputtering of dielectric material which is underneath the SiN layer.

FIG. 2A is a block diagram of a typical small plasma volume containment environment in an etch chamber 140. A wafer 146 is positioned on a lower electrode 144, and an upper electrode is located over the wafer 146 and defining a region of plasma containment 145 between the upper electrode 142 and the wafer 146. In one embodiment of a small plasma volume containment in an etch chamber 140, a plurality of containment rings 148 are disposed between an outer edge of the wafer 146 and an inner wall of the chamber 140, and defining a lateral boundary of the plasma containment region 145. The containment rings 148 are rings within the cylindrical structure of the etch chamber 140 of a desired width and spacing to define a plasma containment area 145 within, and to allow for the spent gasses of the plasma to flow outward and exhaust from the etch chamber 140. The containment rings 148 serve as a slotted confinement shield with each ring comprised of a dielectric such a silica or quartz. For a detailed description of a small plasma volume confinement chamber, reference is made to U.S. Pat. No. 5,534,751, issued on Jul. 9, 1996 to the same assignee as the present application, and which is herein incorporated by reference.

FIG. 2B is a block diagram of a typical large plasma volume containment environment in an etch chamber 140. A wafer 146 is positioned on a lower electrode 144, and an upper electrode is positioned over the wafer 146 and defining a region of plasma containment 145 between the upper electrode 142 and the wafer 146. In the large plasma volume containment environment, a plasma confinement structure 150 is positioned at a distance far enough away from the wafer 146 to provide for a large volume for plasma flow. The plasma confinement structure 150 can be physical with apertures in structures constructed of materials such as quartz or silica to allow for the neutral species of the plasma to flow outward and exhaust from the etch chamber 140 ensuring the dissipation of ion energy prior to exhaust. The plasma confinement structure 150 can also be magnetic with the magnetic energy expelling the ions and the electrons, or charged species, from passing through the confinement structure of the etch chamber 140. For a detailed description of an etch chamber configured for large plasma volume confinement, reference is made to U.S. Pat. No. 6,170,429, issued on Jan. 9, 2001 to the same assignee as the present application, and which is herein incorporated by reference.

As described above, the plasma etching operations of an exemplary multi-step semiconductor fabrication process can require a plurality of plasma volume environments to optimize the required etching process. What is needed is a single plasma etch chamber that can be configured for either small plasma volume containment or large plasma volume containment. The single chamber should be capable of being configured to a plasma etch system incorporating a plurality of such configurable chambers to increase efficiency and throughput while decreasing downtime and cost of operation.

SUMMARY OF THE INVENTION

Broadly speaking, the present invention fills these needs by providing a plasma processing chamber that is configurable for a plurality of plasma volume applications.

In accordance with one aspect of the invention, a plasma processing chamber is provided. The plasma processing chamber includes a bottom electrode configured to support a substrate for processing, and a top electrode located over the bottom electrode. The plasma processing chamber also includes a plasma confinement assembly which is designed to transition between a closed orientation and an open orientation. In the closed orientation, the plasma confinement assembly defines a first volume for plasma during processing, and in the open orientation, the plasma confinement assembly defines a second volume for plasma during processing which is larger than the first volume.

In accordance with another aspect of the invention, a plasma etch process chamber having configurable plasma volume is provided. The plasma etch process chamber includes configurable plasma confinement rings that defined a plurality of separate parallel passages that allow gas flow through the rings. The configurable plasma confinement rings are disposed around a pair of parallel electrodes which defines a first plasma confinement region where a plasma is generated and confined by the parallel passages which neutralize ion particles in the plasma when they pass through the parallel passages. The configurable plasma confinement rings are configurable to be positioned in an extended position defining the first plasma confinement region, and in a retracted position which defines a second plasma confinement region. The plasma etch process chamber further includes an upper chamber liner configured to line an upper region of the plasma etch process chamber and having an outer plasma confinement structure with a plurality of apertures.

In accordance with yet another aspect, a semiconductor wafer processing chamber having a configurable plasma volume is provided. The chamber includes an upper electrode and a lower electrode which is parallel to the upper electrode and is configured to receive a semiconductor wafer for processing. The chamber further includes a first plasma confinement region. The first plasma confinement region has the upper electrode as an upper boundary and the lower electrode as a lower boundary. A second plasma confinement region is defined which has the upper electrode as an upper boundary, the lower electrode as a lower boundary, and an upper chamber liner as a lateral boundary The upper chamber liner lines an upper region of the semiconductor wafer processing chamber and is configured with an outer plasma confinement structure. The chamber further includes a plasma confinement assembly which has at least one plasma confinement ring, a plurality of spacers, and a plurality of shafts. The plasma confinement assembly is positioned within the semiconductor wafer process chamber, is disposed around the first plasma confinement region, and defines a plurality of parallel circumferential passages. The plasma confinement assembly is configured to be positioned in an extended position to defined the first plasma confinement region, and in a retracted position to define the second plasma confinement region.

The advantages of the present invention are numerous. One notable benefit and advantage of the invention is that a single chamber can be configured for a plurality of plasma etch processes. Typically, in order to achieve the benefits offered in the single chamber of the present invention, it has been necessary to either combine a plurality of chambers often from different manufactures. With the size and expense of system tools and the cost of obtaining and operating fab space, duplication of tools is not an economical or efficient option. The present invention provides for maximizing efficiency and economy by providing a single chamber that can be configured for a plurality of precision plasma etch processes.

Another significant advantage is the ability to optimize the plasma etch processes in a single system or chamber. In multi-step plasma etch processes, intermediate etching operations often require specific configuration to achieve optimum etch for a particular process. Typically, in the prior art, a choice is elected to either achieve the best possible etch result for the plurality of etch processes with a single tool in a set configuration, or to combine separate machines and systems to achieve the desired configurations for specific processes from different chambers. Single tool configurations typically result in less than optimal processing, and the combination of separate machines and systems typically results in increased expense, increased transfer and handling time, and increased potential for contamination. Operating and maintaining entire systems, often from different manufacturers, for individual process steps significantly increases the cost of operation in such areas as maintenance, training, and fab floor space and configuration, in addition to the individual equipment costs.

Another advantage of the present invention is the increased throughput with decreased cost of operation. The present invention provides for both clean operation and for deposition operation. By performing both operations in a single chamber, the useful life of consumables such as chamber liners is increased, down time for wet cleans and other clean and/or maintenance operations is reduced when spread across a range of etch processes, and throughput is therefore increased with a more efficient utilization of production equipment.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for an etch chamber with controlled plasma volume using a plurality of confinement structures is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
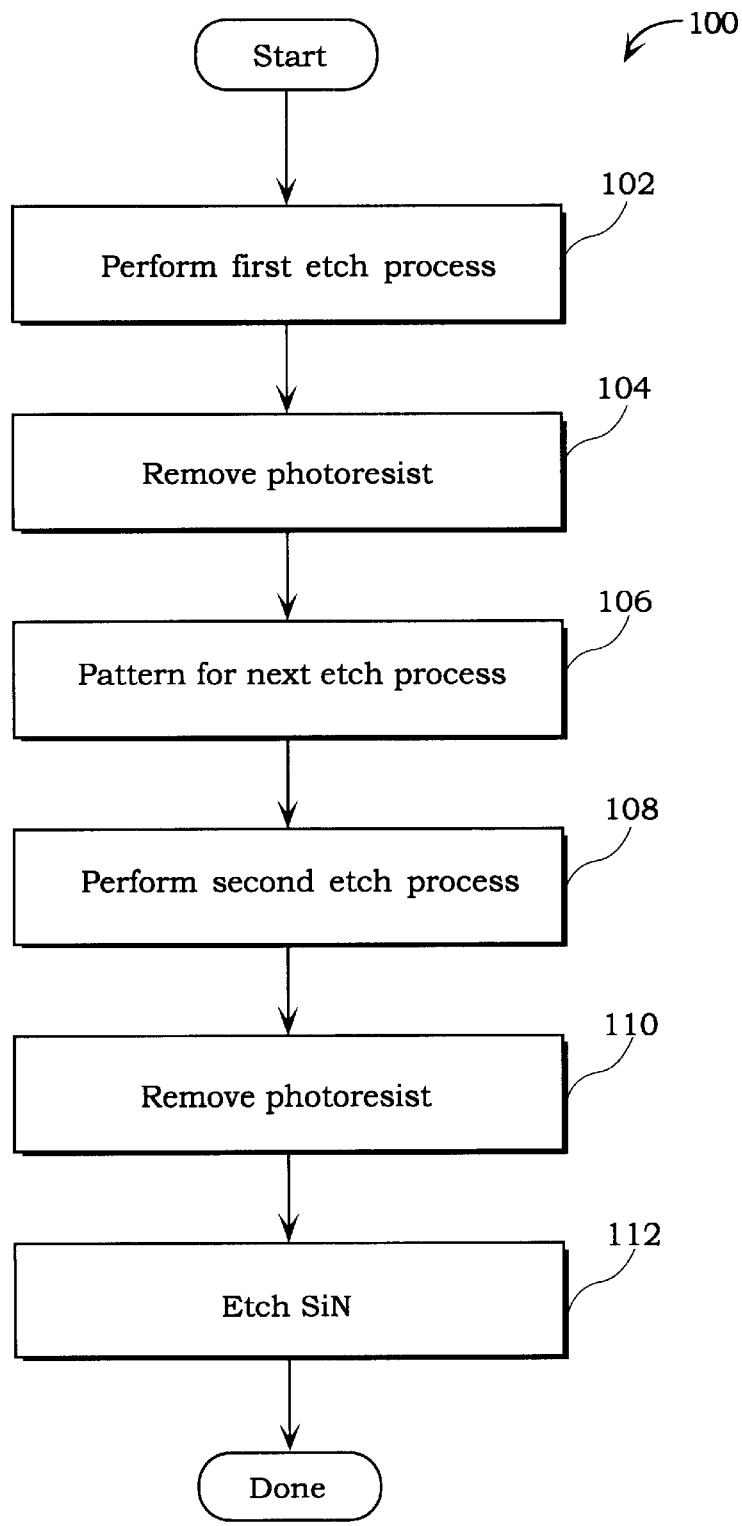
FIG. 1A is a flow chart diagram illustrating the method operations for the etching processes of a typical via-first dual damascene fabrication process.
Figure 1B:
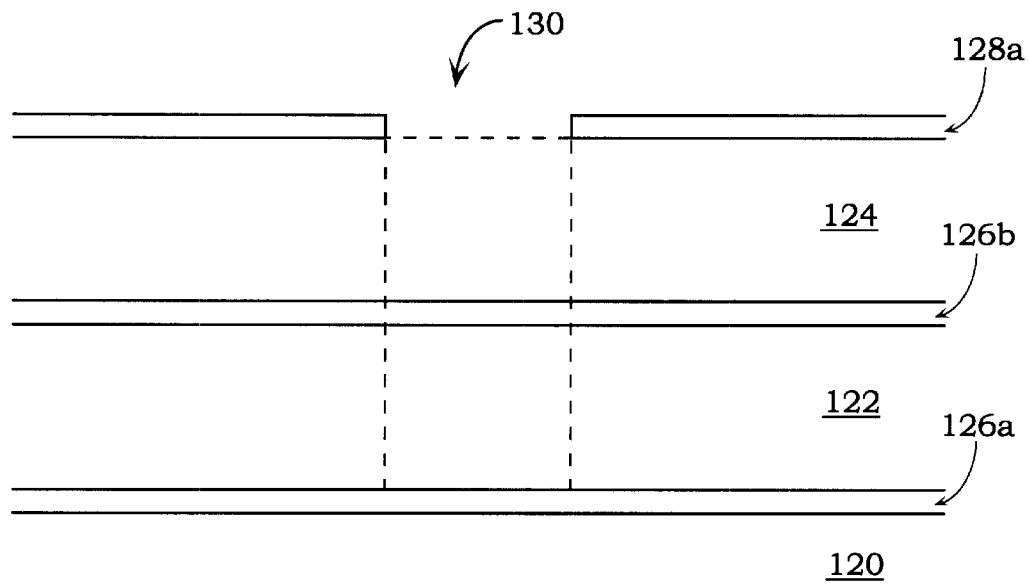
FIG. 1B shows an exemplary substrate, over which has been deposited a barrier layer, first dielectric layer, an etch stop layer, and a second dielectric layer.
Figure 1C:
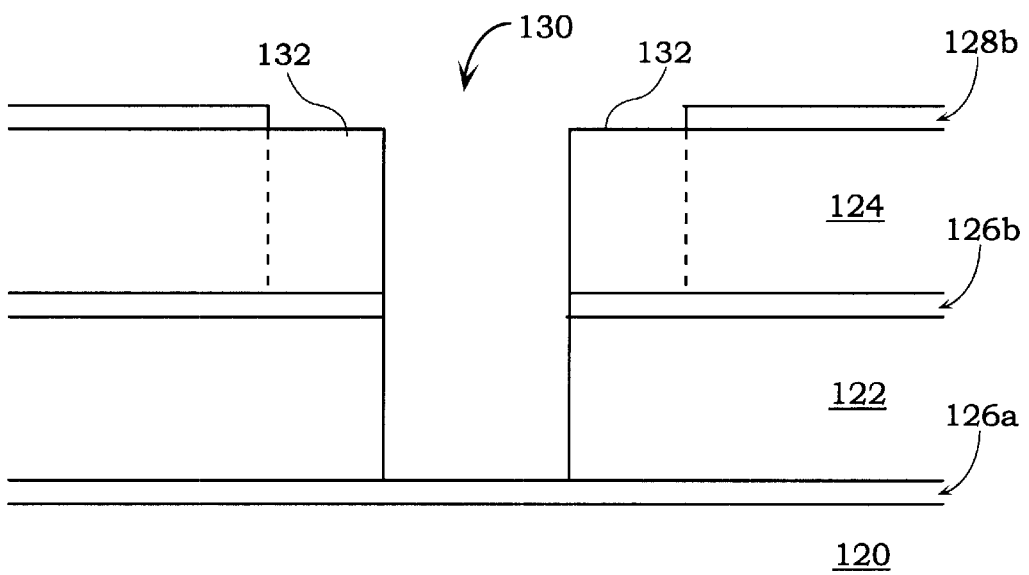
FIG. 1C shows the exemplary structure of FIG. 1B in which a via 130 has been etched.
Figure 1D:
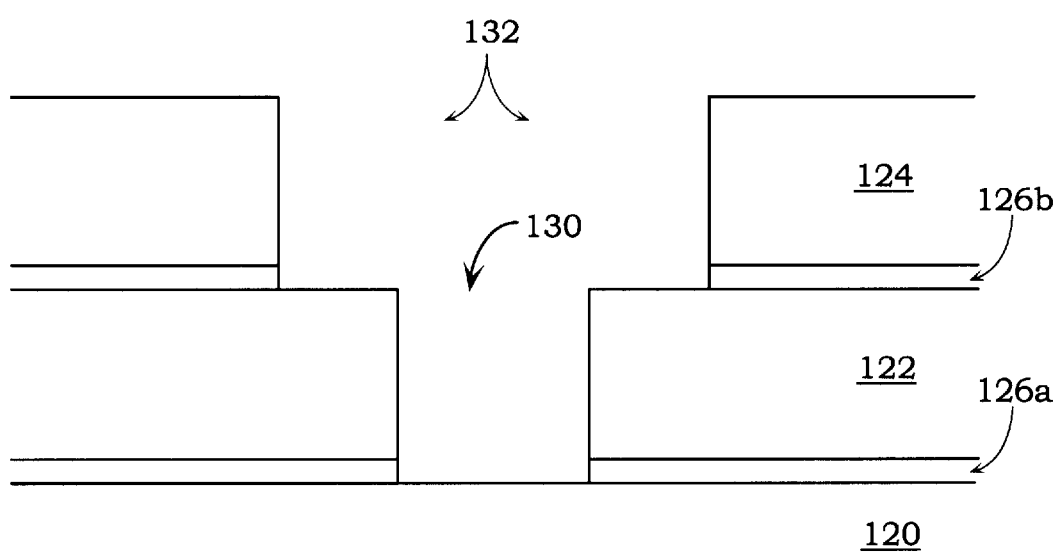
FIG. 1D shows the completed features defined using etching processes in the fabrication of dual damascene structures.
Figure 2A:
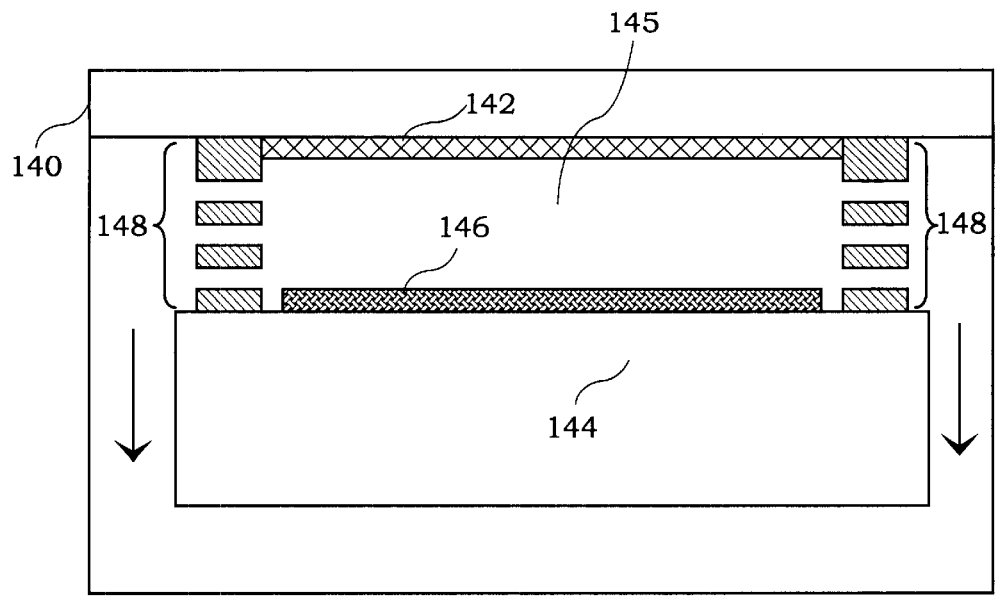
FIG. 2A is a block diagram of a typical small plasma volume containment environment in an etch chamber.
Figure 2B:
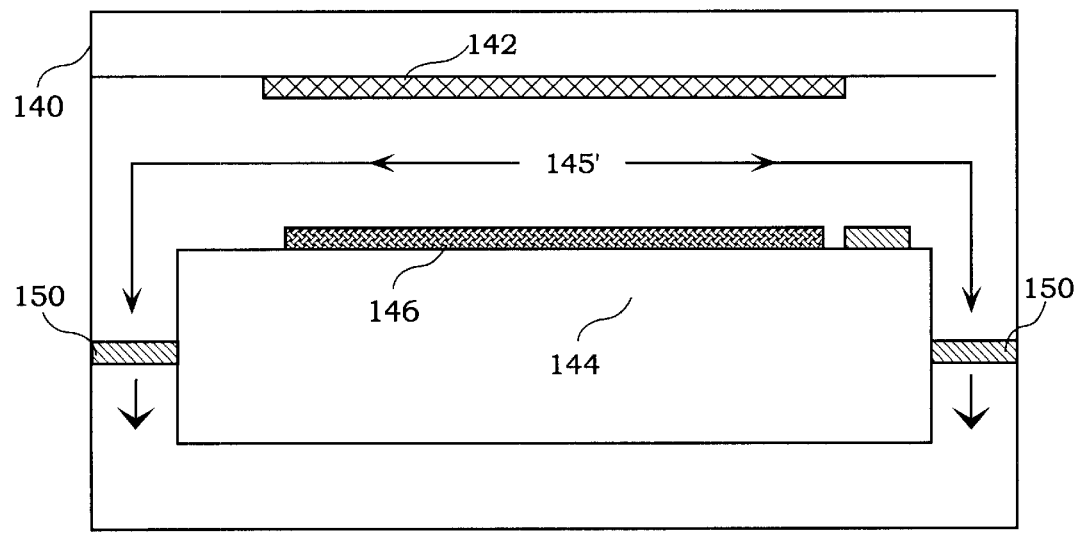
FIG. 2B is a block diagram of a typical large plasma volume containment environment in an etch chamber.
Figure 3A:
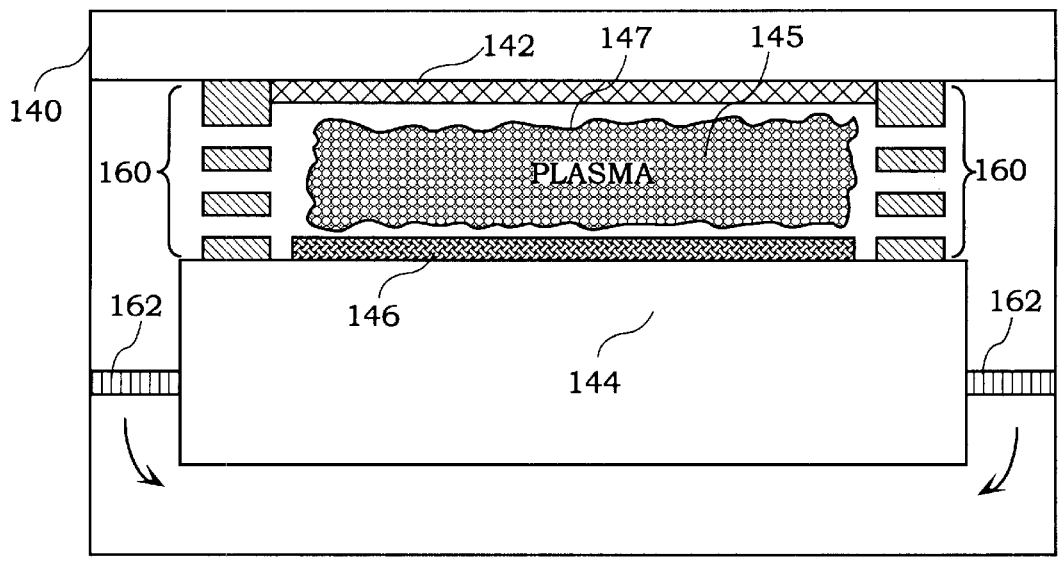
FIG. 3A shows a block diagram of an etch chamber with a configurable plasma volume confinement region in accordance with one embodiment of the present invention.

FIG. 3A shows a block diagram of an etch chamber 140 with a configurable plasma volume confinement region 145 in accordance with one embodiment of the present invention. The etch chamber 140 includes an upper electrode 142, a lower electrode 144, and a small plasma volume confinement region 145 defined between the upper electrode 142 and the lower electrode 144. A wafer 146 to be etched is positioned on the lower electrode 144.

The etch chamber 140 depicted in FIG. 3A is shown configured to a small plasma volume confinement. Plasma confinement rings 160 are shown defining a small plasma volume confinement region 145 with a lateral boundary near the perimeter of the wafer 146. The plasma confinement rings 160 of the present invention define a confinement assembly and are configured to be positioned as shown in FIG. 3A defining a small plasma volume confinement region 145, as well as retracting to open the small plasma volume confinement region 145 into a larger volume within the plasma etch chamber 140. In the small plasma volume confinement region 145 configuration as shown in FIG. 3A, the plasma confinement rings 160 are disposed around the upper 142 and lower 144 parallel electrodes, thereby defining the small plasma volume confinement region 145 as bounded by the plasma confinement rings 160 and the upper electrode 142 and the lower electrode 144.

The plasma confinement rings 160, in one embodiment, are constructed of materials such as quartz or silica with a plurality of stacked plasma confinement rings 160 having spaces therebetween. The spaces create distinct parallel circumferential slots or passages through which spent gases from the small volume of plasma 147 exit the small plasma volume confinement region 145 to be exhausted from the etch chamber 140. The slots or passages are spaced apart in a direction normal to that of the flow of the exhausting gasses through the plasma confinement rings 160 and further configured to neutralize any remaining ion particles so that substantially only neutral species of the plasma is exhausted from the etch chamber 140.

Figure 3B:
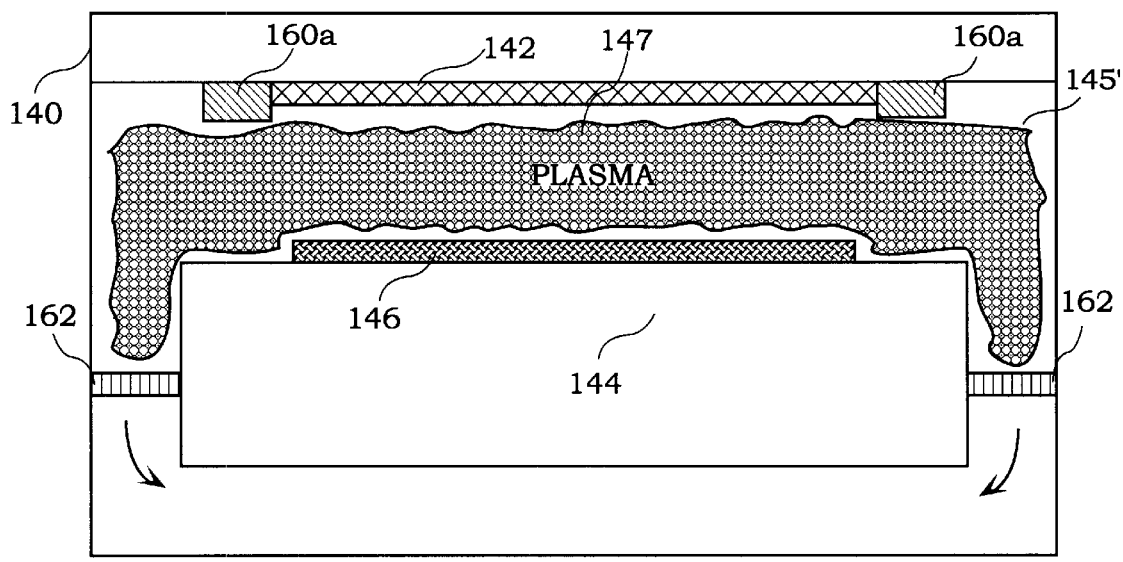
FIG. 3B shows a block diagram of an etch chamber with a configurable plasma volume confinement region in accordance with another embodiment of the present invention.

FIG. 3B shows a block diagram of an etch chamber 140 with a large plasma volume confinement region 145', which is configurable, in accordance with another embodiment of the present invention. The etch chamber 140 includes an upper electrode 142, a lower electrode 144, and a large plasma volume confinement region 145' defined between the upper electrode 142 and the lower electrode 144. A wafer 146 to be etched is positioned on the lower electrode 144. The etch chamber 140 shown in FIG. 3B is generally structurally identical to the etch chamber 140 shown in FIG. 3A.

The etch chamber 140 depicted in FIG. 3B is shown configured to a large plasma volume confinement. Plasma confinement rings 160a are shown withdrawn or retracted opening the plasma volume confinement region to define the large plasma volume confinement region 145'. The lateral boundary of the large plasma volume confinement region 145' is the etch chamber 140 interior wall with an outer plasma confinement structure 162 defining an outer boundary of the large plasma volume confinement region 145' and allowing for neutral species of the plasma to flow to exhaust. The outer plasma confinement structure 162, in one embodiment of the invention is a physical structure constructed of materials such as quartz or silica with apertures defined therein to allow the neutral species of the plasma from the large volume of plasma 147 to flow through to an exhaust and turbopump (not shown) while extinguishing any ion particles that may remain. In another embodiment, the outer plasma confinement structure 162 is magnetic and configured such that magnetic energy expels any remaining ion particles before exhausting the spent gases from the etch chamber 140.

Figure 4:
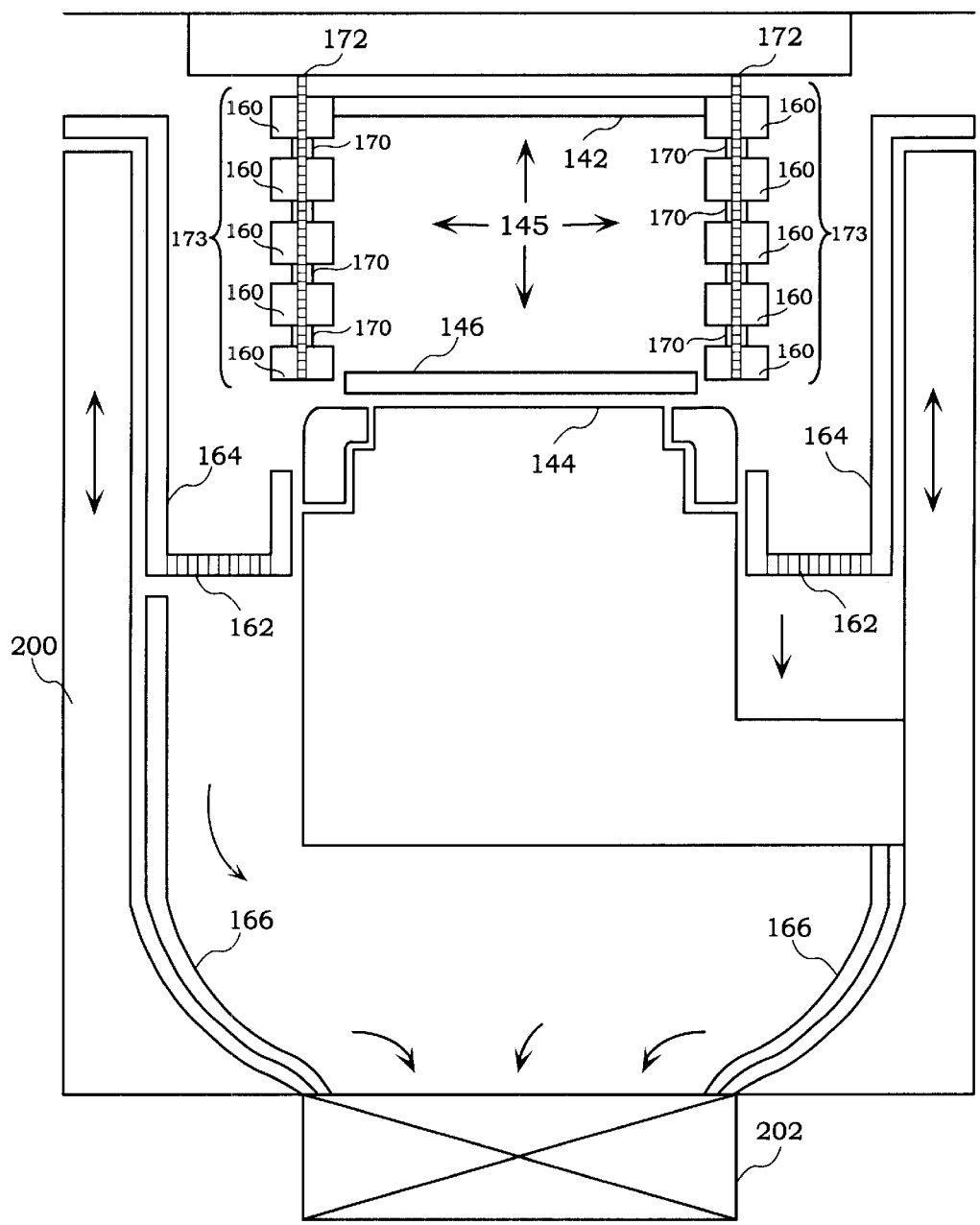
FIG. 4 illustrates a configurable plasma volume confinement etch chamber in accordance with one embodiment of the present invention.

FIG. 4 illustrates a configurable plasma volume confinement etch chamber 200 in accordance with one embodiment of the present invention. The etch chamber 200 includes a top electrode 142 and a bottom electrode 144 with a semiconductor wafer 146 disposed thereon. The etch chamber 200 is shown configured for a small plasma volume confinement with plasma confinement rings 160 positioned to define the lateral boundaries of the small plasma volume confinement region 145. The top electrode 142 and the bottom electrode 144 with the semiconductor wafer 146 disposed thereon define the top and bottom boundaries of the small volume plasma confinement region 145, respectively.

The configurable plasma volume confinement etch chamber 200 includes an outer plasma confinement structure 162 which is functional as a plasma confinement structure 162 when the etch chamber 200 is configured for large plasma volume. When the etch chamber 200 is configured for a small volume, the outer plasma confinement structure 162 remains in place providing a redundant baffle through which neutral species of the plasma must pass when exhausting from the etch chamber 140 through turbopump 202.

In one embodiment, plasma confinement rings 160 are configured to extend between a peripheral edge of the upper electrode 142 and a peripheral edge of the lower electrode 146 so that the plasma created by the ionization of the reactive gases with applied RF energy is confined within the small plasma volume confinement region 145 defined between the confinement rings 160 and the electrodes 142, 144 just over the surface of the wafer 146. The plasma confinement rings 160 define a slotted confinement shield constructed of a plurality of circular rings 160. The circular rings 160 are constructed of a dielectric such as silica or quartz, and adjacent rings are separated by spacers 170 creating circumferential slots or passages between the circular rings 160 through which neutral species of the plasma are exhausted. The circumferential slots thereby form parallel passages that are spaced apart in a direction normal to the flow of plasma or gasses through the parallel passages.

The spacers 170 are similarly constructed of a dielectric such a silica or quartz, or conducting materials such as silicon carbide or doped silicon, and the slots or passages are configured to extinguish any ion particles remaining in the exhausting gases which flow through the confinement rings 160, and through the etch chamber 200 to exhaust through turbopump 202. In one embodiment, the outer plasma confinement structure 162 provides a redundant baffle through which the exhausting gases from the plasma pass while flowing to the turbopump 202. Additionally, the exhaust from the etch chamber 200 to the turbopump 202 is constructed with a plurality of baffles (not shown) to prevent any residual ions in the exhausting gases, or any polymer residue, from flowing into the turbopump 202.

In one embodiment, the plasma confinement rings 160 are connected by shafts 172. The shafts 172 can be constructed of a lightweight, low particulate-generating substance such as nylon, and are configured to support the confinement rings 160 and spacers 170. The spacers are configured to telescope around the shafts 172 and between the confinement rings 160 to create the desired space between rings to neutralize any ion particles or electrons from the plasma that may traverse the slots or passages when the plasma confinement rings 160 are extended to define a small plasma volume confinement region 145. The plasma confinement rings 160, spacers 170, and shafts 172 together form a confinement assembly 173. In one embodiment, the confinement assembly 173 includes at least one plasma confinement ring 160. In another embodiment, the confinement assembly 173 includes a stack of six plasma confinement rings 160. When the confinement assembly 173 is retracted to configure a large plasma volume confinement region 145 (See FIG. 5), the shafts 172 withdraw from the confinement region 145, collapsing the spacers 170 within adjacent rings 160 and thereby collapsing the stack of plasma confinement rings 160.

When the plasma confinement rings 160 are retracted, the large plasma volume is created with boundaries extending to a chamber liner 164 configured in the etch chamber 200, and the outer plasma confinement structure 162. As is known, plasma etching operations generate polymer deposits and resulting particulate contamination as well as RF signal interference and temperature fluctuations. The polymer deposit problems are generally not an issue in small plasma volume confinement configurations. The polymer deposit in small volume confinement configurations is generally quickly cleaned using oxygen plasma. Large plasma confinement configurations, however, remain subject to polymer deposit issues, and, in one embodiment of the present invention, chamber liners 164, 166 are incorporated to provide thermal stability, an adequate RF ground return path, and serviceability with minimal downtime. Upper chamber liner 164 is configured to the outer plasma confinement structure 162, and lower chamber liner 166 is configured to line the lower region of the etch chamber 200 wall from the outer plasma confinement structure 162 to the base of the etch chamber 200 and turbopump 202 exhaust.

Figure 5:
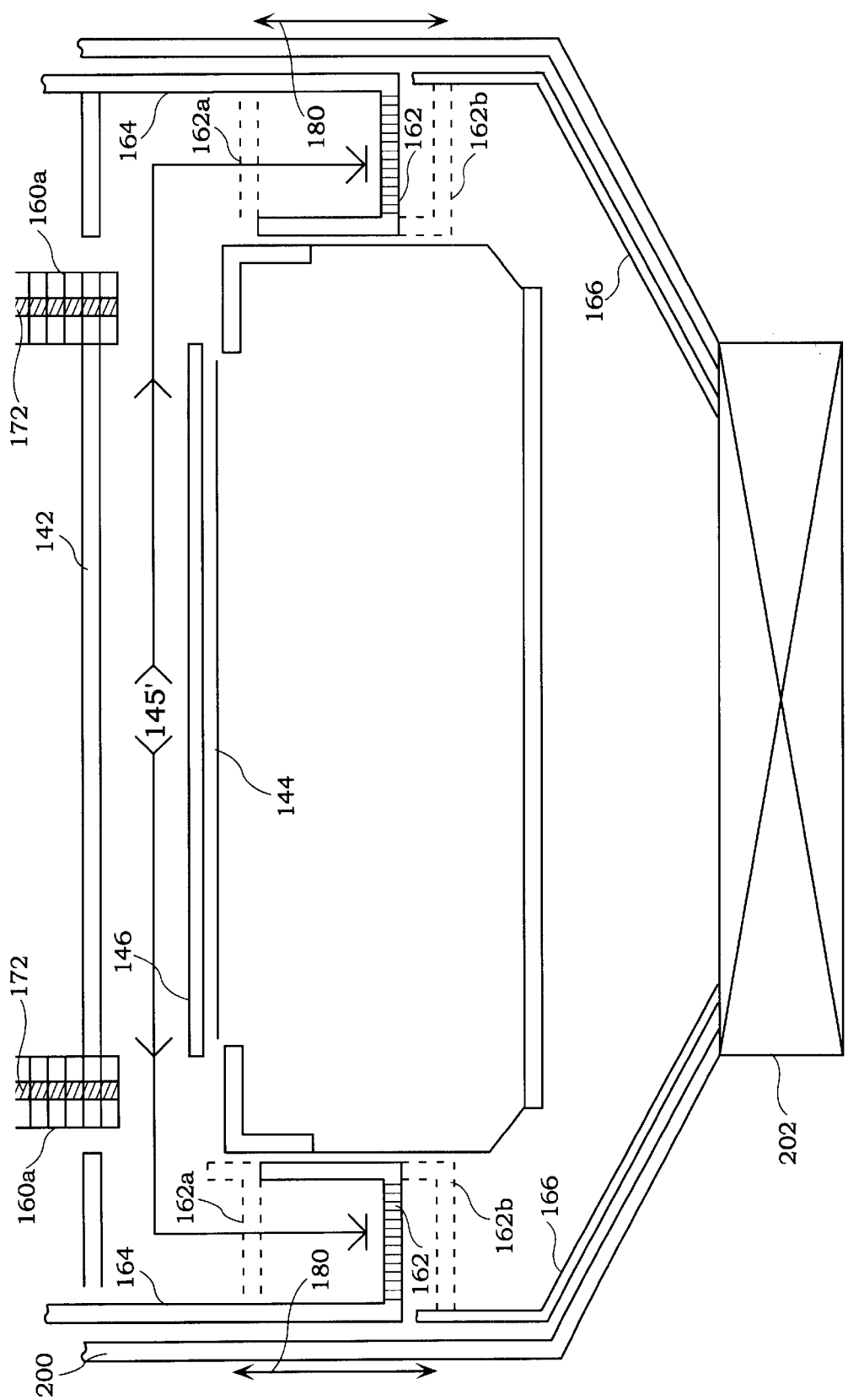
FIG. 5 shows a configurable plasma volume confinement etch chamber in accordance with another embodiment of the present invention.

FIG. 5 shows a configurable plasma volume confinement etch chamber 200 in accordance with another embodiment of the present invention. The etch chamber 200 in FIG. 5 is shown configured for large plasma volume confinement. Plasma confinement rings 160a have been withdrawn or retracted from the etch chamber 200, creating the large plasma confinement region 145' to the large volume defined by the upper chamber liner 164, the outer plasma confinement structure 162, the upper electrode 142, and the lower electrode 144. In the embodiment illustrated, the plasma confinement rings 160a have been withdrawn or retracted through an overhead or chamber lid structure. In an alternative embodiment, the plasma confinement rings 160a withdraw or retract into the chuck and/or electrode 144 structure.

In the large plasma volume confinement configuration as shown in FIG. 5, plasma fills the larger volume of the volume confinement region 145 resulting in a high bias voltage and high plasma flow at low pressure. Such plasma generally results in higher polymer deposition on chamber surfaces within the large plasma volume confinement region 145', and therefore the upper chamber liner 164 is desired. Additionally, lower chamber liner 166 is desirable due to accumulating build-up of polymer residue that flows through the outer plasma confinement structure 162 with the neutral species of the plasma flow exhausting from the etch chamber 200 to the turbopump 202.

Outer plasma confinement structure 162 is configured to define a boundary of the large plasma volume confinement region 145', and to facilitate neutralization of any remaining ions and electrons, or charged species, from the substantially neutral species of plasma. Spent plasma gases therefore flow through the outer plasma confinement structure while the plasma sheath is confined to the large plasma volume confinement region 145'. In one embodiment of the invention, the outer plasma confinement structure 162 is configurable to be positioned along vertical axis 180 in order to achieve a desired range of density and flow of the plasma sheath. Such positioning of the outer plasma confinement structure 162 enables some variation between the small plasma volume confinement region 145 with the plasma confinement rings 160 extended (FIG. 4), and the large plasma volume confinement region 145' as shown in FIG. 5. It should be recognized that variable positioning of the outer plasma confinement structure 162 requires the lower chamber liner 162 to be configured to ensure adequate and continuous inner chamber wall coverage. The variable positioning of the outer plasma confinement structure 162 would typically range from a large plasma volume 162a with the outer plasma confinement structure 162 positioned near a mid-region of the interior of the etch chamber 200 near a position even with a top surface of the lower electrode 144, to a largest plasma volume 162b with the outer plasma confinement structure 162 positioned near a lower region of the interior of the etch chamber 200. In one embodiment, variable confinement is configured through a plurality of chamber liner 164, 166 structures. A chamber liner 164, 166 having an outer plasma confinement structure 162 integral to the upper chamber liner 164 is selected according to the desired plasma volume. In this manner, any one of a plurality of chamber liner 164, 166 structures is utilized to configure the etch chamber 200 for a desired plasma volume.

Thus configured, the configurable plasma volume confinement etch chamber 200 can achieve optimum plasma volume in accordance with the desired etch process. The same embodiment of the present invention can be configured for small plasma volume with the plasma volume confinement assembly extended and plasma volume confinement rings defining a small plasma volume confinement region, and then the plasma confinement rings can transition from an extended position to a retracted position to define a large plasma confinement region. The transitioning of the plasma confinement assembly from an extended or closed position to a retracted or open position, or from a retracted position to an extended position, configures the same processing chamber to either a large plasma volume confinement processing chamber or a small plasma volume confinement processing chamber. Additionally, when the chamber is configured for large plasma volume confinement, the outer plasma containment structure is configurable to vary the size of the large plasma volume confinement.

Returning to the dual damascene example illustrated in FIG. 1, the first etch process of operation 102 is optimally performed with a large plasma volume confinement configuration as illustrated in FIG. 5. The large volume plasma confinement yields a high bias, high flow plasma at low pressure and a resulting uniform, controlled etch.

Next, the first photoresist removal 104 is optimally performed with a small volume oxygen plasma confinement configuration as illustrated in FIG. 4. The small plasma volume confinement is optimal for oxygen plasma etching and yields high density plasma with low ion energy to the wafer and high etch rate which is most desirable for a photoresist removal operation.

After the patterning of the next features, the second etch process 108 is performed. As described above in reference to FIG. 1, the second etch process 108 can be optimized with either a small plasma volume or a large plasma volume confinement, depending on the particular structure, and degree of etch desired. Generally, if the structure includes an optional etch stop layer, the optimal configuration would be a large plasma volume configuration as shown in FIG. 5. The etch stop typically serves as a barrier through which a specific etch chemistry that is most effective for a dielectric layer will not rapidly proceed. The high flow, high bias of the large plasma volume configuration is typically desired for this particular etching process. Additionally, the variable positioning of the outer plasma confinement structure 162 described in reference to FIG. 5 might provide the most optimum etching plasma volume by reducing the plasma volume region 145 with a higher position within the etch chamber 200.

If no optional etch stop is utilized, the optimal configuration is most likely a small plasma volume confinement configuration. The high density, high etch rate achieved in small plasma volume confinement is desirable to precisely etch through an upper dielectric layer, stopping at the second dielectric layer.

The second photoresist removal 110 and the SiN etch 112 are both operations that are generally optimized with a small plasma volume confinement configuration. High density plasma volume confinement configuration. High density etch is generally preferred for such processes. Low bias, or low ion energy to the wafer, is preferred as described above, and also preferred for the specific application of SiN etching when minimizing the sputtering of the underlying dielectric material is a consideration.

In one embodiment, the configurable plasma volume confinement etch chamber is suitable for all etch operations.

In one configuration, the chamber is optimized for clean mode operations, and in another configuration, the chamber is optimized for deposition mode operations. Therefore, a single configurable plasma volume confinement etch chamber is suitable for stripping, nitride, and oxide etch processes. Compatible chambers, therefore, can be combined in a single system to achieve optimal semiconductor wafer fabrication achieving a high through put with minimal transfer time or down time, and while minimizing cost by utilizing multiple function, single system tools.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma processing chamber, comprising;
   a bottom electrode configured to support a substrate for processing;
   a top electrode located over the bottom electrode; and
   a plasma confinement assembly designed to transition between a closed orientation and an open orientation, the closed orientation defining a first volume for plasma during processing and the open orientation defining a second volume for plasma during processing, wherein the first volume is smaller than the second volume.

2. A plasma processing chamber as recited in claim 1, wherein the confinement assembly includes a plurality of plasma confinement rings.

3. A plasma processing chamber as recited in claim 2, wherein the plurality of plasma confinement rings transition together.

4. A plasma processing chamber as recited in claim 2, wherein the plurality of plasma confinement rings are spaced apart by spacers, and the plasma confinement rings and spacers are attached to shafts.

5. A plasma processing chamber as recited in claim 1, wherein shafts are designed to move so as to transition the plasma confinement assembly between the closed and open orientation.

6. A plasma processing chamber as recited in claim 1, wherein plasma processing in the open orientation enables an increased plasma flow rate and an increased bias voltage.

7. A plasma processing chamber as recited in claim 1, wherein plasma processing in the closed orientation enables higher density plasma generation, relative to plasma processing in the open orientation.

8. A plasma processing chamber as recited in claim 7, wherein in the closed orientation, higher pressure plasma processing is enabled, relative to plasma processing in the open orientation.

9. A plasma processing chamber as recited in claim 1, further comprising:
   a confinement structure configured to surround the bottom electrode at a level below a level of the bottom electrode.

10. A plasma processing chamber as recited in claim 9, wherein the confinement structure is attached to a liner of the plasma processing chamber.

11. A plasma processing chamber as recited in claim 9, wherein the confinement structure is adjustable in position, the position being adjustable closer or further from the level of the bottom electrode, wherein an adjustment in the position changes the second volume.

12. A plasma etch process chamber having configurable plasma volume, comprising:
    configurable plasma confinement rings defining a plurality of separate parallel passages that allow gas flow through the configurable plasma confinement rings from an inner surface to an outer surface, the parallel passages being spaced apart in a direction normal to that of the flow of gases through the parallel passages, the configurable plasma confinement rings being disposed around a pair of parallel electrodes defining therebetween a first plasma confinement region where a plasma is generated, and the parallel passages being proportioned for essentially confining the plasma within the first plasma confinement region by neutralizing ion particles created in the plasma when the ion particles pass through the parallel passages; and
    an upper chamber liner configured to line an upper region of the plasma etch process chamber and having an outer plasma confinement structure with a plurality of apertures;
    wherein the configurable plasma confinement rings are configurable to be positioned in one of an extended position defining the first plasma confinement region and a retracted position defining a second plasma confinement region.

13. A plasma etch process chamber having configurable plasma volume as recited in claim 12, wherein the second plasma confinement region is bounded by the pair of parallel electrodes, the upper chamber liner, and the outer plasma confinement structure.

14. A plasma etch process chamber having configurable plasma volume as recited in claim 13, wherein the plurality of apertures of the outer plasma confinement structure are proportioned for essentially confining the plasma within the second plasma confinement region.

15. A plasma etch process chamber having configurable plasma volume as recited in claim 12, wherein the upper chamber liner is configured to position the outer plasma confinement structure in one of a plurality of positions.

16. A plasma etch process chamber having configurable plasma volume as recited in claim 12, wherein the configurable plasma confinement rings are constructed of a dielectric.

17. A plasma etch process chamber having configurable plasma volume as recited in claim 12, wherein the configurable plasma confinement rings include spacers, and the configurable plasma confinement rings and spacers are attached to shafts.

18. A plasma etch process chamber having configurable plasma volume as recited in claim 17, wherein the shafts are designed to transition the configurable plasma confinement rings between the extended position and the retracted position.

19. A plasma etch process chamber having configurable plasma volume as recited in claim 12, wherein plasma processing with the configurable plasma confinement rings in the retracted position enables an increased plasma flow rate and an increased bias voltage.

20. A plasma etch process chamber having configurable plasma volume as recited in claim 12, wherein plasma processing with the configurable plasma confinement rings in the extended position enables higher density plasma generation, relative to plasma processing with the configurable plasma confinement rings in the retracted position.

21. A plasma etch process chamber having configurable plasma volume as recited in claim 12, wherein the configurable plasma confinement rings in the extended position enables higher pressure plasma processing is relative to plasma processing with the configurable plasma confinement rings in the retracted position.

22. A semiconductor wafer processing chamber having a configurable plasma volume, comprising:
   an upper electrode;
   a lower electrode being parallel to the upper electrode and being configured to receive a semiconductor wafer for processing;
   a first plasma confinement region having the upper electrode as an upper boundary and the lower electrode as a lower boundary;
   a second plasma confinement region having the upper electrode as an upper boundary, the lower electrode as a lower boundary, and an upper chamber liner as a lateral boundary, wherein the upper chamber liner is configured with an outer plasma confinement structure and configured to line an upper region of the semiconductor wafer processing chamber; and
   a plasma confinement assembly having at least one plasma confinement ring, a plurality of spacers, and a plurality of shafts, the plasma confinement assembly being positioned within the semiconductor wafer process chamber disposed around the first plasma confinement region and defining a plurality of parallel circumferential passages;
   wherein the plasma confinement assembly is configured to be positioned in one of an extended position to define the first plasma confinement region, and a retracted position to define the second plasma confinement region.

23. A semiconductor wafer processing chamber having a configurable plasma volume as recited in claim 22, wherein the plurality of shafts are designed to transition the plasma confinement assembly between the extended position and the retracted position.

24. A semiconductor wafer processing chamber having a configurable plasma volume as recited in claim 22, wherein plasma processing with the plasma confinement assembly in the retracted position enables an increased plasma flow rate and an increased bias voltage.

25. A semiconductor wafer processing chamber having a configurable plasma volume as recited in claim 22, wherein plasma processing with the plasma confinement assembly in the extended position enables higher density plasma generation, relative to plasma processing with the plasma confinement assembly in the retracted position.

26. A semiconductor wafer processing chamber having a configurable plasma volume as recited in claim 25, wherein plasma processing with the plasma confinement assembly in the extended position enables higher pressure plasma processing relative to plasma processing with the plasma confinement assembly in the retracted position.

27. A semiconductor wafer processing chamber having a configurable plasma volume as recited in claim 22, wherein the outer plasma confinement structure includes a plurality of apertures proportioned for essentially confining plasma within the second plasma confinement region.

28. A semiconductor wafer processing chamber having a configurable plasma volume as recited in claim 27, wherein the outer plasma confinement structure is adjustable in position, the position being adjustable closer or further from a level of the bottom electrode, and wherein an adjustment in the position changes a volume of the second plasma confinement region.

29. A semiconductor wafer processing chamber having a configurable plasma volume as recited in claim 28, wherein the outer plasma confinement structure is constructed of a dielectric.

30. A semiconductor wafer processing chamber having a configurable plasma volume as recited in claim 22, wherein the at least one plasma confinement ring is constructed of a dielectric.

31. A semiconductor wafer processing chamber having a configurable plasma volume as recited in claim 22, wherein the plasma confinement assembly has six plasma confinement rings.

* * * * *